(12) United States Patent
Bhagwagar et al.

(10) Patent No.: US 8,334,592 B2
(45) Date of Patent: Dec. 18, 2012

(54) THERMAL INTERFACE MATERIAL, ELECTRONIC DEVICE CONTAINING THE THERMAL INTERFACE MATERIAL, AND METHODS FOR THEIR PREPARATION AND USE

(75) Inventors: Dorab Bhagwagar, Saginaw, MI (US); Donald Liles, Midland, MI (US); Nick Shephard, Midland, MI (US); Shengqing Xu, Midland, MI (US); Zuchen Lin, Midland, MI (US); G. M. Fazley Elahee, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 242 days.

(21) Appl. No.: 12/668,495

(22) PCT Filed: Sep. 5, 2008

(86) PCT No.: PCT/US2008/075312
§ 371 (c)(1),
(2), (4) Date: Apr. 27, 2010

(87) PCT Pub. No.: WO2009/035907
PCT Pub. Date: Mar. 19, 2009

(65) Prior Publication Data
US 2010/0208432 A1 Aug. 19, 2010

Related U.S. Application Data

(60) Provisional application No. 60/971,299, filed on Sep. 11, 2007.

(51) Int. Cl.
*H01L 23/06* (2006.01)

(52) U.S. Cl. ............... 257/729; 257/E23.08; 427/123; 427/401; 427/201; 427/404; 428/457; 428/327; 428/626; 361/717; 252/74; 165/185

(58) Field of Classification Search ............... 257/729, 257/E23.08; 427/13, 401, 201, 404; 428/457, 428/327, 626; 361/717; 165/185
See application file for complete search history.

(56) References Cited

U.S. PATENT DOCUMENTS

| 3,232,543 A | 2/1966 | Pasteka |
| 4,383,650 A | 5/1983 | Contal et al. |
| 4,557,857 A | 12/1985 | Sorensen |
| 4,594,134 A | 6/1986 | Hanada et al. |

(Continued)

FOREIGN PATENT DOCUMENTS

EP    0915122 A1    5/1999

(Continued)

OTHER PUBLICATIONS

Dogan, O.N., J.A.Hawk, J.H.Tylczak, R.D.Wilson R.D.Govier, "Wear of titanium carbide reinforced metal matrix composites," Wear, 1999, pp. 758-769, vol. 225-229, US Department of Energy, Albany, Oregon.

(Continued)

*Primary Examiner* — Bradley K Smith
*Assistant Examiner* — Timor Karimy
(74) *Attorney, Agent, or Firm* — Erika Takeuchi

(57) ABSTRACT

A thermal interface material includes a thermally conductive metal matrix and coarse polymeric particles dispersed therein. The composite can be used for both TIM1 and TIM2 applications in electronic devices.

43 Claims, 3 Drawing Sheets

U.S. PATENT DOCUMENTS

| | | | |
|---|---|---|---|
| 4,742,142 | A | 5/1988 | Shimizu et al. |
| 4,743,670 | A | 5/1988 | Yoshida et al. |
| 4,761,454 | A | 8/1988 | Oba et al. |
| 5,045,972 | A | 9/1991 | Supan et al. |
| 5,062,896 | A | 11/1991 | Huang et al. |
| 5,173,256 | A | 12/1992 | Booth et al. |
| 5,198,189 | A | 3/1993 | Booth et al. |
| 5,286,417 | A | 2/1994 | Mahmoud et al. |
| 5,328,087 | A | 7/1994 | Nelson et al. |
| 5,387,624 | A | 2/1995 | Morita et al. |
| 5,445,308 | A | 8/1995 | Nelson et al. |
| 5,455,738 | A | 10/1995 | Montesano et al. |
| 5,588,600 | A | 12/1996 | Perfido et al. |
| 5,738,936 | A | 4/1998 | Hanrahan et al. |
| 5,965,197 | A | 10/1999 | Jin et al. |
| 6,027,575 | A | 2/2000 | Paruchuri et al. |
| 6,110,761 | A | 8/2000 | Ahmad et al. |
| 6,114,413 | A | 9/2000 | Kang et al. |
| 6,265,085 | B1 | 7/2001 | Watanabe et al. |
| 6,281,573 | B1 | 8/2001 | Atwood et al. |
| 6,342,680 | B1 | 1/2002 | Nakagawa et al. |
| 6,365,973 | B1 | 4/2002 | Koning |
| 6,448,329 | B1 | 9/2002 | Hirschi et al. |
| 6,504,242 | B1 | 1/2003 | Deppisch et al. |
| 6,589,459 | B2 | 7/2003 | Nakagawa et al. |
| 6,624,224 | B1 | 9/2003 | Misra |
| 6,656,770 | B2 | 12/2003 | Atwood et al. |
| 6,665,186 | B1 | 12/2003 | Calmidi et al. |
| 6,673,434 | B2 | 1/2004 | Nguyen |
| 6,706,219 | B2 | 3/2004 | Nguyen |
| 6,783,692 | B2 | 8/2004 | Bhagwagar |
| 6,791,839 | B2 | 9/2004 | Bhagwagar |
| 6,797,758 | B2 | 9/2004 | Misra et al. |
| 6,815,486 | B2 | 11/2004 | Bhagwagar et al. |
| 6,838,022 | B2 | 1/2005 | Khanna |
| 6,906,427 | B2 | 6/2005 | Tanaka et al. |
| 6,926,955 | B2 | 8/2005 | Jayaraman et al. |
| 6,940,721 | B2 | 9/2005 | Hill |
| 6,946,190 | B2 | 9/2005 | Bunyan |
| 6,984,685 | B2 | 1/2006 | Misra et al. |
| 6,995,205 | B2 | 2/2006 | Matsukawa et al. |
| 7,014,093 | B2 | 3/2006 | Houle et al. |
| 7,036,573 | B2 | 5/2006 | Koning et al. |
| 7,074,490 | B2 | 7/2006 | Feng et al. |
| 7,147,367 | B2 | 12/2006 | Balian et al. |
| 7,172,711 | B2 | 2/2007 | Nguyen |
| 7,180,174 | B2 | 2/2007 | Koning et al. |
| 7,187,083 | B2 | 3/2007 | Lewis et al. |
| 7,219,713 | B2 | 5/2007 | Gelorme et al. |
| 7,332,807 | B2 * | 2/2008 | Dani et al. ............ 257/706 |
| 7,622,529 | B2 | 11/2009 | Walton et al. |
| 2002/0070445 | A1 | 6/2002 | Tarter |
| 2002/0192488 | A1 | 12/2002 | Kurihara et al. |
| 2003/0077478 | A1 | 4/2003 | Dani et al. |
| 2003/0128521 | A1 | 7/2003 | Matayabas et al. |
| 2003/0209801 | A1 | 11/2003 | Hua et al. |
| 2004/0075076 | A1 | 4/2004 | Bhagwagar |
| 2004/0131835 | A1 | 7/2004 | Schmitt et al. |
| 2005/0045855 | A1 | 3/2005 | Tonapi et al. |
| 2005/0056365 | A1 | 3/2005 | Chan |
| 2005/0155752 | A1 | 7/2005 | Larson et al. |
| 2005/0171269 | A1 | 8/2005 | Hu et al. |
| 2005/0261140 | A1 | 11/2005 | Yamada et al. |
| 2006/0040112 | A1 | 2/2006 | Dean et al. |
| 2006/0112857 | A1 | 6/2006 | Hougham et al. |
| 2006/0194920 | A1 | 8/2006 | Capote et al. |
| 2006/0292840 | A1 | 12/2006 | Lin et al. |
| 2007/0042533 | A1 | 2/2007 | Endo et al. |
| 2007/0158823 | A1 | 7/2007 | Dani et al. |
| 2007/0166554 | A1 | 7/2007 | Ruchert et al. |
| 2008/0063879 | A1 | 3/2008 | Lin et al. |
| 2009/0214870 | A1 | 8/2009 | Morita et al. |
| 2009/0234078 | A1 | 9/2009 | Ueki et al. |
| 2009/0253846 | A1 | 10/2009 | Fukui |
| 2009/0275688 | A1 | 11/2009 | Sekiba |

FOREIGN PATENT DOCUMENTS

| | | |
|---|---|---|
| EP | 1414063 A2 | 4/2004 |
| WO | WO 2004/075261 A2 | 9/2004 |
| WO | WO 2006/107004 A1 | 10/2006 |
| WO | WO 2007/027019 A1 | 3/2007 |
| WO | WO 2007/037019 A1 | 4/2007 |
| WO | WO 2007/106209 A2 | 9/2007 |

OTHER PUBLICATIONS

MMCC, Metal Matrix Cast Composites, MetGraf™ Thermal Management Products, Waltham, Massachusetts.

Chung, D.D.L., "Materials for Thermal Conduction," Applied Thermal Engineering, 2001, pp. 1593-1605, vol. 21, State University of New York at Buffalo, Buffalo, NY.

Cornie, James A., et. al., "Discontinuous Graphite Reinforced Aluminum, and Copper Alloys for High Thermal Conductivity—Thermal Expansion Matched Thermal Management Applications," Metal Matrix Composites, LLC., 2003, Waltham, Massachusetts.

Kas'Yanova, I.N., et. al., "Study of the heat stabilising effect of oxides of rare-earth metals in vulcanisates of methylvinylsiloxane rubbers under conditions of limited air access," International Polymer Science and Technology, 1975, pp. T/5-T/6, vol. 2, No. 1.

* cited by examiner

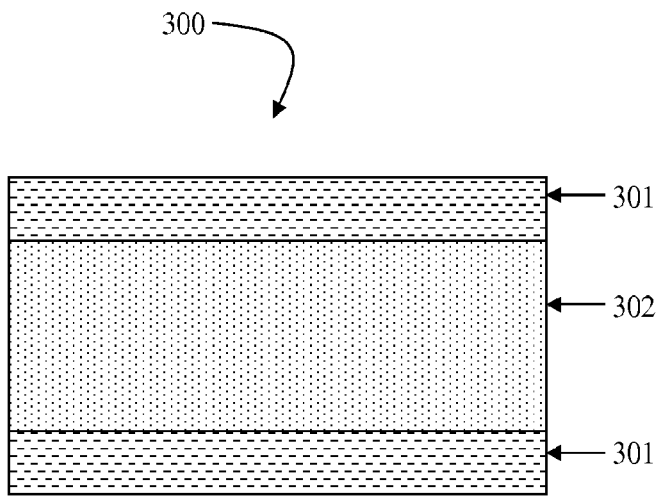
Figure 3
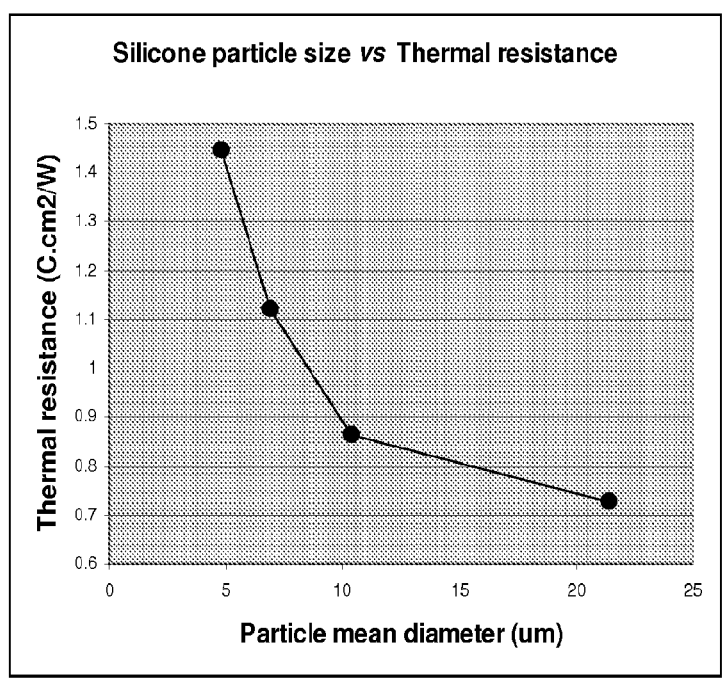
Figure 4. Measured thermal resistance as a function of particle size of silicone particles in indium composite films. Particle mean diameter is expressed in micrometers.

THERMAL INTERFACE MATERIAL, ELECTRONIC DEVICE CONTAINING THE THERMAL INTERFACE MATERIAL, AND METHODS FOR THEIR PREPARATION AND USE

CROSS-REFERENCE TO RELATED APPLICATIONS

This application is a U.S. national stage filing under 35 U.S.C. §371 of PCT Application No. PCT/US08/075312 filed on 5 Sep. 2008, currently pending, which claims the benefit of U.S. Provisional Patent Application No. 60/971,299 filed 11 Sep. 2007 under 35 U.S.C. §119(e). PCT Application No. PCT/US08/075312 and U.S. Provisional Patent Application No. 60/971,299 are hereby incorporated by reference.

STATEMENT REGARDING FEDERALLY SPONSORED RESEARCH

None

BACKGROUND OF THE INVENTION

Heat generating electronic components such as a semiconductor, transistor, integrated circuit (IC), discrete device, light emitting diode (LED), and others known in the art are designed to operate at a normal operating temperature or within a normal operating temperature range (normal operating temperature). However, if sufficient heat is not removed during operation, the electronic component will operate at a temperature significantly above its normal operating temperature. Excessive temperatures can adversely affect performance of the electronic component and operation of the electronic device associated therewith and negatively impact mean time between failures.

To avoid these problems, heat can be removed by thermal conduction from the electronic component to a heat sink. The heat sink can then be cooled by any convenient means such as convection or radiation techniques. During thermal conduction, heat can be transferred from the electronic component to the heat sink by surface contact between the electronic component and the heat sink or by contact of the electronic component and heat sink with a thermal interface material (TIM). The lower the thermal impedance of the medium, the greater the flow of heat from the electronic component to the heat sink.

Surfaces of the electronic component and the heat sink are typically not completely smooth; therefore, it is difficult to achieve full contact between the surfaces. Air spaces, which are poor thermal conductors, appear between the surfaces and increase impedance. These spaces can be filled by inserting a TIM between the surfaces.

Some commercially available TIMs have matrices of polymers or elastomers and thermally conductive fillers dispersed therein. However, elastomer matrices suffer from the drawbacks that they may be difficult to apply in an uncured state, and they may not fully adhere or mesh with the surfaces if cured before application. Polymer matrices suffer from the drawback that they can flow out of the spaces after application. These TIMs may also suffer from the drawback of lacking sufficient thermal conductivity as electronic devices become smaller because the electronic components generate more heat in a smaller area, or as silicon carbide (SiC) based electronic devices are developed because SiC electronic components have higher normal operating temperatures than the electronic components discussed above.

Solder materials have also been proposed as TIMs. However, solders with melting points below normal operating temperatures may suffer from the drawback of needing encapsulation with an elastomer or dam to prevent the solder from flowing out of the spaces after application. Solder materials with melting temperatures above normal operating temperatures are generally applied at significantly higher thickness than conventional TIMs. This creates the drawback of increased cost because more solder material is used to create a thicker bondline. Solder materials that contain low coefficient of thermal expansion (CTE) materials, such as alumina, zinc oxide, and graphite may lack sufficient ductility or thermal conductivity, or both, for some TIM applications. These TIMs may also be quite expensive due to raw material costs.

BRIEF SUMMARY OF THE INVENTION

A composite comprises a thermally conductive metal and polymeric particles. The composite may be used in TIM applications.

BRIEF DESCRIPTION OF THE DRAWINGS

FIG. 3 is a cross section of an alternative thermal interface material.
FIG. 4 is graph of thermal resistance as a function of particle size.

REFERENCE NUMERALS

Figure 1:
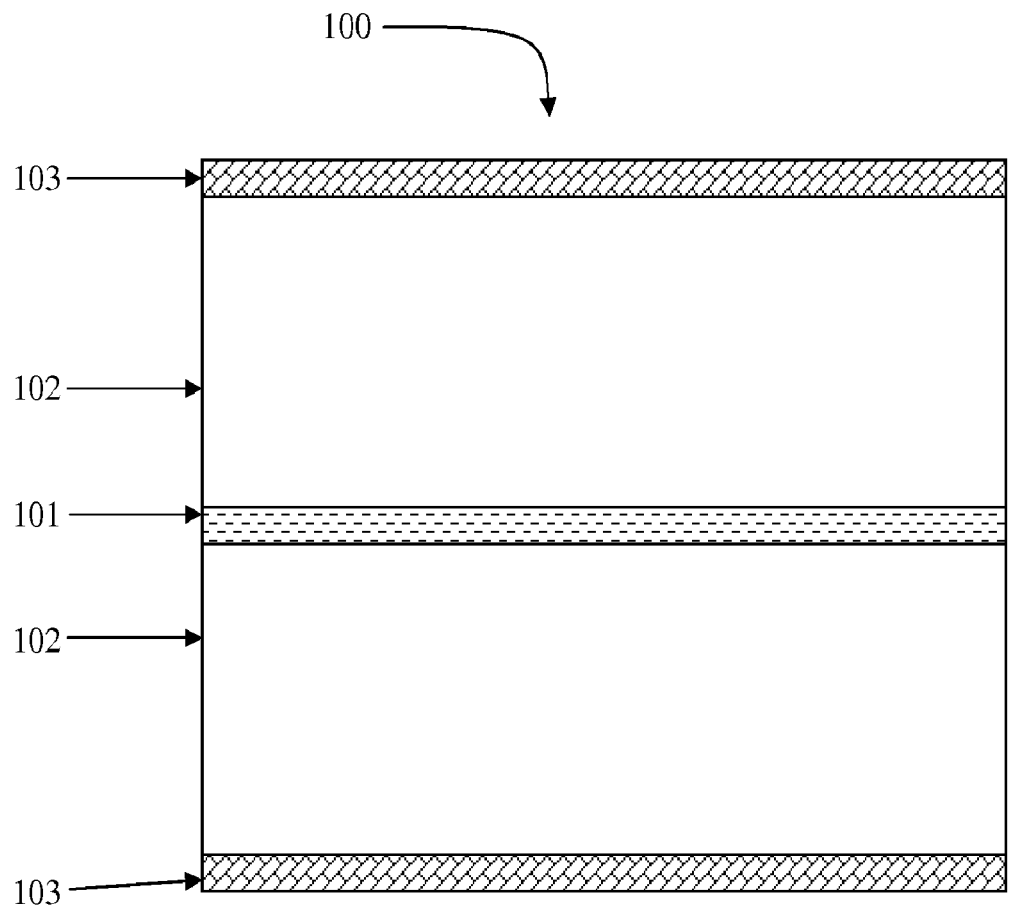
FIG. 1 is a cross section of a thermal interface material.

100 TIM
101 substrate
102 composite
103 release liner
200 electronic device
201 IC chip
202 substrate
203 die attach adhesive
204 spacers
205 solder balls
206 pads
207 TIM1
208 metal cover
209 heat sink
210 TIM2
211 thermal path
TIM
301 thermally conductive metal
302 composite

DETAILED DESCRIPTION OF THE INVENTION

A TIM comprises a thermally conductive metal and coarse polymeric particles (particles) in the thermally conductive metal. The TIM is useful in both TIM1 and TIM2 applications. Alternatively, the TIM may have a laminate structure. For example, this TIM may comprise:
 I) a composite comprising
  a) a thermally conductive metal, and
  b) particles in the first thermally conductive metal; and
 II) a thermally conductive material on a surface of the composite.

The thermally conductive material, II) may be a second thermally conductive metal, which may have a melting point lower than the melting point of the thermally conductive metal, a). Alternatively, the thermally conductive material, II), may be a thermally conductive grease, such as Dow Corning® SC 102, or another thermally conductive compound.

Alternatively, the composite, I), may be formed into a film with having first and second opposing surfaces. The film may have II) the thermally conductive material on the first opposing surface. The film may optionally further comprise III) a second thermally conductive material on the second opposing surface. The thermally conductive materials II) and III) may be the same or different. The thermally conductive materials II) and III) may be, for example, thermally conductive metals or thermally conductive compounds such as thermally conductive greases. The thermally conductive metals II) and III) may be the same or different.

The TIM comprising the composite without a layer of another thermally conductive material on a surface of the composite is useful in commercial TIM applications. Alternatively, the composite with a layer of a thermally conductive metal on one side (and optionally a second thermally conductive metal on another side) may be used in commercial TIM applications in various electronic devices. Alternatively, when the composite has a thermally conductive compound as the thermally conductive material on a surface of the composite, this may be useful in test vehicle applications for testing integrated circuit chips. Suitable thermally conductive compounds are commercially available from Dow Corning Corporation of Midland, Mich. USA, such as Dow Corning® SC 102, and Dow Corning® thermally conductive compounds such as CN-8878, TC-5020, TC-5021, TC-5022, TC-5025, TC-5026, TC-5121, TC-5600, and TC-5688. The thermally conductive compound may be a thermally conductive grease comprising a noncurable polydiorganosiloxane and a thermally conductive filler.

Matrix

Thermally conductive metals are known in the art and are commercially available. The thermally conductive metal may be a metal such as Silver (Ag), Bismuth (Bi), Gallium (Ga), Indium (In), Tin (Sn), Lead (Pb), or an alloy thereof; alternatively, the thermally conductive metal may comprise In, Sn, Bi, Ag, or an alloy thereof. The alloy of Ag, Bi, Ga, In, or Sn may further comprise Aluminum (Al), Gold (Au), Cadmium (Cd), Copper (Cu), Nickel (Ni), Antimony (Sb), Zinc (Zn), or a combination thereof. Examples of suitable alloys include Sn—Ag alloys, In—Ag alloys, In—Bi alloys, Sn—Pb alloys, Bi—Sn alloys, Ga—In—Sn alloys, In—Bi—Sn alloys, Sn—In—Zn alloys, Sn—In—Ag alloys, Sn—Ag—Bi alloys, Sn—Bi—Cu—Ag alloys, Sn—Ag—Cu—Sb alloys, Sn—Ag—Cu alloys, Sn—Ag alloys, Sn—Ag—Cu—Zn alloys, and combinations thereof. Examples of suitable alloys include $Bi_{95}Sn_5$, $Ga_{95}In_5$, $In_{97}Ag_3$, $In_{53}Sn_{47}$, $In_{52}Sn_{48}$ (commercially available as In 52 from AIM of Cranston, R.I., USA), $Bi_{58}Sn_{42}$ (commercially available as Bi 58 from AIM), $In_{66.3}Bi_{33.7}$, $In_{95}Bi_5$, $In_{60}Sn_{40}$ (commercially available from AIM), $Sn_{85}Pb_{15}$, $Sn_{42}Bi_{58}$, $Bi_{14}Pb_{43}Sn_{43}$ (commercially available as Bi14 from AIM), $Bi_{52}Pb_{30}Sn_{18}$, $In_{51}Bi_{32.5}Sn_{16.5}$, $Sn_{42}Bi_{57}Ag_1$, $SnAg_{2.5}Cu_{0.8}Sb_{0.5}$ (commercially available as CASTIN® from AIM), $SnAg_{3.0}Cu_{0.5}$ (commercially available as SAC305 from AIM), $Sn_{42}Bi_{58}$ (commercially available from AIM), $In_{80}Pb_{15}Ag_4$ (commercially available as In 80 from AIM), $SnAg_{3.8}Cu_{0.5}$ (commercially available as SAC387 from AIM), $SnAg_{4.0}Cu_{0.5}$ (commercially available as SAC405 from AIM), $Sn_{95}Ag_5$, SN 100C commercially available from AIM), $Sn_{99.3}Cu_{0.7}$, $Sn_{97}Sb_3$, $Sn_{36}Bi_{52}Zn_{12}$, $Sn_{17}Bi_{57}Zn_{26}$, $Bi_{50}Pb_{27}Sn_{10}Cd_{13}$, and $Bi_{49}Zn_{21}Pb_{18}Sn_{12}$. Alternatively, the alloy may be any of the alloys described above that are Lead-free. Lead-free means the alloy contains less than 0.01% by weight of Pb. Alternatively, the alloy may be any of the alloys described above that comprise Indium. Alternatively, the alloy may be any of the alloys described above that are Indium-free. Indium-free means that the alloy contains less than 0.01% by weight of In. Alternatively, the alloy may be a non-eutectic alloy with a broad melting point range.

The exact melting point of the thermally conductive metal may be selected by one of ordinary skill in the art depending on various factors including the type of electronic device in which the TIM will be used. The thermally conductive metal may have a melting point higher than the normal operating temperature of the electronic device. And, the TIM may have a melting point lower than the fabrication temperature of the electronic device. For example, the TIM may have a melting point at least 5° C. above the normal operating temperature of the electronic device. For example, when an electronic device contains a conventional heat generating electronic component such as a semiconductor, transistor, IC, or discrete device, the thermally conductive metal can have a melting point ranging from 50° C. to 300° C., alternatively 60° C. to 250° C., or alternatively 150° C. to 300° C. Alternatively, when the TIM will be used with an LED, the thermally conductive metal can have a melting point ranging from 80° C. to 300° C. or alternatively 100° C. to 300° C. Alternatively, when the TIM will be used with a SiC electronic component generating heat, the normal operating temperature of the electronic device may be higher than when a conventional heat generating electronic component will be used. In this TIM application, the thermally conductive metal can have melting point ranging from 150° C. to 300° C. or alternatively 200° C. to 300° C.

When the TIM has a laminate structure comprising I) a composite comprising a) a first thermally conductive metal and b) particles in the thermally conductive metal; and II) a second thermally conductive metal on a surface of the composite; the first and second thermally conductive metals may both be selected from the examples given above, with the proviso that II) the second thermally conductive metal has a melting point at least 5° C., alternatively at least 30° C., below a melting point of a) the first thermally conductive metal. Alternatively, the melting point of II) the second thermally conductive metal may be 5° C. to 50° C. below the melting point of a) the first thermally conductive metal. In the laminate structure, the melting point of II) the second thermally conductive metal may be at least 5° C. above the normal operating temperature of the electronic device and below the fabrication temperature of the device, and the melting point of a) the first thermally conductive metal may be above or below (alternatively at least 5° C. above) the fabrication temperature of the electronic device.

The amount of the thermally conductive metal in the TIM depends on various factors including the metal or alloy selected and the type of particles selected, however, the amount is sufficient to make the thermally conductive metal a continuous phase in the TIM. Alternatively, the amount of thermally conductive metal may range from 50 vol % to 99 vol % of the TIM, alternatively 60 vol % to 90 vol %, or alternatively 55 vol % to 60 vol %.

Particles

The coarse polymeric particles can relieve mechanical stress. The particles can undergo elastic deformation or plastic deformation. The particles have an elastic modulus lower than the elastic modulus of the thermally conductive metal.

The particles comprise polymers, which may be organic polymers, silicone polymers, silicone-organic copolymers, or combinations thereof. Organic particles suitable for use herein are known in the art and are commercially available. Exemplary organic particles include polycarbonate, polyester, polyether sulfone, polyether ether ketone, polyisobutylene, polyolefins, polyphenylsulfide, polystyrene, polyurethane, and their halogenated derivatives. The organic particles may optionally be halogenated. Exemplary fluorinated organic particles are commercially available as VITON® from DuPont Performance Elastomers L.L.C., of Wilmington, Del., U.S.A. Metal coated coarse polymeric particles are available from microParticles GmbH in Germany.

The particles may be present in an amount ranging from 1 vol % to 50 vol % of the TIM, alternatively 10 vol % to 40 vol %, alternatively 40 vol % to 45 vol %, or alternatively 10 vol % to 30 vol %. The shape of the particles is not critical. The particles may be, for example, spherical, fibrous, porous (e.g., having a sponge like structure), hollow, or combinations thereof. Alternatively, particles may be spherical or irregular. Alternatively, the particles may comprise aggregated clumps of particles (aggregates). The shape of the particles may depend on their method of manufacture. The particles may be cured or uncured, e.g., high molecular weight polymers. The particles may be elastomeric or resinous or a combination thereof. The particles may be discrete in the TIM, and the particles may form a discontinuous phase. The particles may be crosslinked.

The particles may have an average particle size of at least 15 micrometers, or alternatively at least 50 micrometers. Alternatively, the particles may have an average particle size ranging from 15 micrometers to 150 micrometers, alternatively 50 micrometers to 100 micrometers, alternatively 15 micrometers to 70 micrometers or alternatively 50 micrometers to 70 micrometers. Without wishing to be bound by theory, it is thought that fine particles, e.g., with average particle sizes of 5 micrometers or less are not suitable for use in this TIM. Fine particles may have insufficient particle size to serve as spacers in TIM applications. Fine particles may not provide as high of thermal conductivity, or as high of compliancy, as the coarse polymeric particles described herein. Without wishing to be bound by theory, it is thought that the coarse polymeric particles described herein will provide better creep relaxation than fine particles at the same volume loadings.

Furthermore, fine particles may be more difficult to incorporate in a metal matrix than the coarse polymeric particles described herein because fine particles cannot always be incorporated in the same high volumes as the coarse polymeric particles. Such fine particles are frequently produced by a process in which the fine particles may not always reliably be recovered by filtration because due to their elastomeric nature and small particle size, the fine particles would coalesce. The recovery step in the production of these fine particles is performed by, for example, freeze drying or spray drying, which leaves undesirable surfactant on the surface that cannot be completely removed. Fine particles also may have insufficient particle size to serve as spacers in TIM applications.

In contrast, coarse silicone particles useful herein may be prepared by a phase inversion process, and these coarse silicone particles can be recovered by filtration. The surfactant can be completely removed, and optionally, a different coating and/or surface treating agent can be applied to the silicone particles. For example, the coarse silicone particles useful herein may be prepared by a phase inversion process comprising an aqueous emulsion polymerization. In this process, a silicone continuous phase (oil phase) is provided, and into this silicone continuous phase is added a mixture of surfactant and water. Additional water may optionally be added. Without wishing to be bound by theory, it is thought that the ratio of surfactant to water can be adjusted to control particle size. The silicone continuous phase may comprise an alkenyl-functional polyorganosiloxane with a polyorganohydrogensiloxane in the presence of a platinum group metal catalyst. After polymerization, the resulting silicone elastomer particles may be washed and filtered to remove surfactant. Alternatively, a heat stabilizer may be added to the process to provide silicone elastomer particles with improved thermal stability. Examples of suitable heat stabilizers include metal oxides such as ferric oxide, ferroferric oxide, ferric hydroxide, cerium oxide, cerium hydroxide, lanthanum oxide, fumed titanium dioxide, or a combination thereof. This may be particularly useful when the composite will be used as a TIM for a SiC electronic component. When added, the stabilizer may be present in an amount ranging from 0.5% to 5% by weight of the TIM.

Alternatively, SiH functional coarse silicone particles may be used in the matrix. Without wishing to be bound by theory, it is thought that SiH functionality may improve dispersion of the coarse silicone particles in matrices comprising Indium. Suitable SiH functional coarse silicone particles are described below in paragraphs [0029] to [0033].

Method for Making Particles

An exemplary method for preparing these coarse silicone particles may be performed by modifying the process described, for example, in U.S. Pat. Nos. 4,742,142; 4,743,670; and 5,387,624. The ratio of surfactant and water may be varied from the disclosure of U.S. Pat. Nos. 4,742,142; 4,743,670; and 5,387,624 by one of ordinary skill in the art to produce silicone particles of the size he or she desires. In this method, the particles can be made by emulsifying a reactive silicone composition in water with one or more surfactants in the range of 0.1% to 10% by weight of reactive silicone composition. The amount of water used may range from 5% to 95% water, alternatively is 50%, by weight based on the weight of reactive silicone composition. Water can be added in one step or in multiple additions.

The coarse polymeric particles described above may optionally have on their surfaces a metal or a metal oxide. The metal may be the same as or different from the thermally conductive metal described above. The metal may comprise Ag, Al, Au, Bi, Cobalt (Co), Cu, In, Iron (Fe), Ni, Palladium (Pd), Platinum (Pt), Sb, Sn, Zn, or alloys thereof. Alternatively, the metal on the particles may be Ag. The metal oxide may be an oxide of any of the above metals. The metal or metal oxide may be provided on the surface of the particles by various techniques. For example, the particles may be coated by wet metallization. Alternatively, the particles prepared and recovered, for example by filtration, and then the particles may be coated by physical vapor deposition (PVD), chemical vapor deposition (CVD), electroless deposition, immersion, or spraying methods. Without wishing to be bound by theory, it is thought that the metal or metal oxide may have affinity for the thermally conductive metal described above, and may provide improved wetting of the particles by the thermally conductive metal. It is thought that in the TIM, the metal or metal oxide on the surface of the particles may provide a benefit of increased thermal conductivity, improved stability, improved mechanical properties, improved CTE, or combinations thereof.

Alternatively, coarse silicone elastomer particles may be prepared and optionally coated with a metal, for example, by preparing silicone hydride (SiH) functional colloids having either resinous (branched) or linear polymeric structures and metallizing the particles either during or after their preparation. A method for preparing these colloids comprises conducting an emulsion polymerization using silanes such as $R(SiOMe)_3$, $R_2Si(OMe)_2$ in which each R is a monovalent hydrocarbon group or a fluorinated monovalent hydrocarbon group, such as Me, Et, Pr, Ph, $F_3(CH_2)_2$ or $C_4F_9(CH_2)_2$, (where Me represents a methyl group, Et represents an ethyl group, Pr represents a propyl group, and Ph represents a phenyl group) in the presence of an anionic surfactant/acid catalyst such as dodecylbenzenesulfonic acid (DBSA). An exemplary non-SiH containing silane is $MeSi(OMe)_3$, which leads to a colloidal T resin. MQ type resins can also be prepared by emulsion polymerizing $Si(OEt)_4$ (TEOS) and hexamethyldisiloxane or $Me_3SiOMe$. Exemplary starting materials for colloidal MQ resins is TEOS and hexamethyldisiloxane. Emulsion polymerization may be arrested by raising pH of the composition to above 4. One skilled in the art would recognize that M, D, T, and Q refer to siloxane units of the formulae below

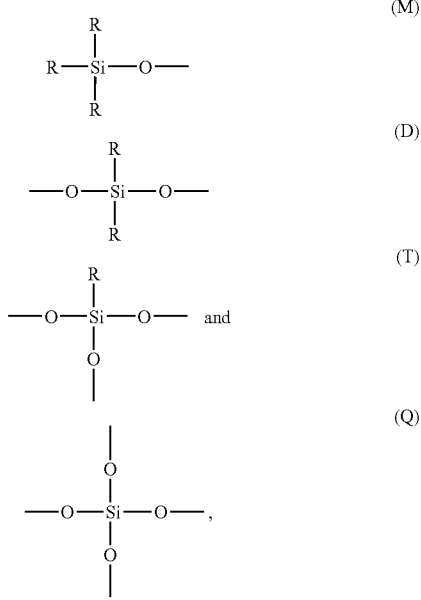

where R is as described above.

SiH functionality may be introduced by copolymerizing SiH functional silanes or low molecular weight SiH functional siloxanes with the above described silanes. An exemplary SiH functional silane is $(MeO)_2SiMeH$. Exemplary SiH functional siloxanes are $(Me_3SiO)_2SiMeH$ and $(HMe_2Si)_2O$. The amount of SiH functional silane or SiH functional siloxane used can be varied from 0.001% to 100%.

It is also possible to stage the addition of the SiH compound so as to prepare a structured colloidal particle. For example, the SiH compound can be added during the latter part of the polymerization such that the particles have a higher SiH content near the particle exterior than the particle interior. By varying both the level of SiH compound and the time of addition, one of ordinary skill in the art would be able to prepare a variety of colloidal compositions bearing SiH functionality.

The SiH functional colloids described herein can constitute reactive dispersions or emulsions. The SiH moiety can undergo reactions while the colloid is in its dispersed state or it can undergo reactions in its coalesced state after removal of water.

The method for preparing metal coated coarse silicone particles comprises treating the SiH containing polymer emulsion or colloid with a solution of a metallic salt. The SiH moiety acts as a reducing agent that reduces certain metal ions to their elemental form. The reactions occur at room temperature and may be complete after several hours. Colloids and elastomer emulsions may be treated, for example, with salts of Ag, Au, Cu and Pt.

Alternatively, coarse polymeric particles may be prepared using a cryogenic crushing process. Such processes are known in the art and are described, for example, in U.S. Pat. Nos. 3,232,543; 4,383,650; and 5,588,600.

The coarse polymeric particles, may have a surface treatment, regardless of whether the particles have metal and/or metal oxide on their surfaces. For example, the surface treatment may be a surface treating agent, a physical treatment (e.g., plasma), or a surface chemical reaction (in situ polymerization). Surface treating agents are known in the art and are commercially available. Suitable surface treating agents include, but are not limited to, alkoxysilanes such as hexyltrimethoxysilane, octyltriethoxysilane, decyltrimethoxysilane, dodecyltrimethyoxysilane, tetradecyltrimethoxysilane, phenyltrimethoxysilane, phenylethyltrimethoxysilane, octadecyltrimethoxysilane, octadecyltriethoxysilane, vinyltrimethoxysilane and methyltrimethoxysilane, 3-methacryloxypropyltrimethoxysilane, 3-glycidoxypropyltrimethoxysilane, 3-aminopropyltrimethoxysilane, and a combination thereof; alkoxy-functional oligosiloxanes; mercaptans and alkylthiols such as octadecyl mercaptan; polysulfides such as sulfido-silanes; fatty acids such as oleic acid, stearic acid; and alcohols such as myristyl alcohol, cetyl alcohol, stearyl alcohol, or a combination thereof; functional alkyl polysiloxanes where the functional group can be alkoxysilyl, silazane, epoxy, acyloxy, oximo, or combinations thereof. For example, the surface treating agent can be an (epoxypropoxypropyl)methylsiloxane/dimethylsiloxane copolymer, a dimethylsiloxane polymer having a group of the formula $Si(OR')_3$ at one end and a group of formula $SiR''_3$ at the other end, where each R' independently represents a monovalent hydrocarbon group such as an alkyl group and each R" independently represents a monovalent hydrocarbon group such as an alkyl group or an alkenyl group. Alternatively, the surface treating agent can be an amino-functional polydimethylsiloxane polymer or a saccharide-siloxane polymer.

The amount of surface treating agent depends on various factors including the type and amount of coarse polymeric particles, however, the amount may range from 0.1% to 5% based on the weight of the coarse polymeric particles. The TIM may optionally further comprise one or more other additives. For example, other additives such as waxes may be added to improve processing.

The thermally conductive metal of the TIM may have a melting point above a normal operating temperature of an electronic device. The TIM may be fabricated, for example as a pad, with a thickness, and the coarse polymeric particles may have an average particle size ranging from 10% to 100% of the thickness of the TIM. For example, when the average particle size is 100% of the thickness, the particles may be used as spacers in the TIM. The average particle size of the particles depends on various factors including the bondline thickness of the TIM and whether the TIM is compressed during or after its fabrication, however, the particles may have an average particle size of at least 15 micrometers. Alternatively, the particles may have an average particle size ranging from 15 micrometers to 150 micrometers, alternatively 50 micrometers to 100 micrometers, alternatively 15 micrometers to 70 micrometers or alternatively 50 micrometers to 70 micrometers. One skilled in the art would recognize that when the coarse polymeric particles are spherical, the average particle sizes described herein represent average particle diameters of coarse polymeric particles.

Method for Preparing the TIM

The TIM may be prepared by any convenient means such as a method comprising 1) heating the thermally conductive metal above its melting point, and 2) mixing the particles with the melted thermally conductive metal. Alternatively, the TIM may be prepared by a method comprising 1) mixing thermally conductive metal particles with coarse polymeric particles, and thereafter 2) heating the product of step 1) to reflow the thermally conductive metal. Alternatively, the method may comprise 1) wrapping the silicone particles in a sheet or foil of the thermally conductive metal, and thereafter 2) reflowing the thermally conductive metal. These methods may optionally further comprise 3) fabricating the product of step 2) to a desired thickness, for example, by compressing, optionally with heating. Alternatively, extrusion pressing or roll milling may be used to fabricate the TIM into the desired thickness. These methods may optionally further comprise cutting the product of step 2) or step 3) into a desired shape. Alternatively, the desired shape can be formed by molding the TIM. Alternatively, the method may comprise 1) applying the particles and thermally conductive metal particles to a substrate, and thereafter 2) reflowing the thermally conductive metal, with or without a fluxing agent. One skilled in the art would recognize that the if the TIM is compressed during or after fabrication; the particle sizes may change. For example, if a spherical elastomeric particle is used, after compression the particle shape will change to be disc shaped and the particle size will change as well. Alternatively, if coarse resin particles are used, the coarse resin particles may act as spacers in the TIM. The exact pressures and temperatures used during fabrication depend on various factors including the melting point of the thermally conductive metal selected and the desired thickness of the resulting composite, however, the temperatures may range from ambient temperature to just below the melting point of the thermally conductive metal, alternatively 60° C. to 120° C.

FIG. 1 shows a cross-section of a TIM described above. In FIG. 1, the TIM 100 comprises a substrate 101, and layers of the composite described above 102 formed on opposing sides of the substrate 101. Release liners 103 are applied over the exposed surfaces of the composite 102.

When the TIM has a laminate structure, the method may further comprise pressing a layer of another thermally conductive metal on a surface of the composite. The method may further comprise heating during pressing. For example, the exact pressures and temperatures used during fabrication depend on various factors including the melting point(s) of the thermally conductive metal(s) selected and the desired thickness of the resulting composite, however, the pressures may range from 30 to 45 psi and the temperatures may range from 40° C. to 130° C. Alternatively, when the composite has a laminate structure, the method may further comprise spreading a thermally conductive compound, such as a grease, on a surface of the composite. Spreading may be performed by any convenient means, such as brush coating or robotic dispensing.

FIG. 3 shows a cross-section of an alternative TIM fabricated as described above. In FIG. 3, the TIM 300 is a laminate film comprising a composite 302 having first and second layers of thermally conductive metal 301 on opposing surfaces of the composite. The thermally conductive metal 301 has a melting point lower than the melting point of the thermally conductive metal of the composite 302. The thermally conductive metal 301 may be free of particles. "Free of particles" means that the thermally conductive metal 301 does not have particles dispersed therein or has fewer particles dispersed therein than the thermally conductive metal of the composite 302. The TIM 300 may be prepared by any convenient means, for example, by pressing the thermally conductive metal 301 on opposing surfaces of the composite 302. The thermally conductive metal 301 may have a melting point above a normal operating temperature of an electronic device and below a fabrication temperature of the electronic device.

Electronic Device

An electronic device can comprise the TIM described above. The electronic device comprises:
 i) a first electronic component,
 ii) a second electronic component,
 iii) the TIM described above, where the TIM is interposed between the first electronic component and the second electronic component. The first electronic component may be a semiconductor chip and the second electronic component may be a heat sink. Alternatively, the first electronic component may be a semiconductor chip and the second electronic component may be a heat spreader (TIM1 application). Alternatively, the first electronic component may be a heat spreader and the second electronic component may be a heat sink (TIM2 application). In the electronic device the TIM1 and the TIM2 may be the same or different thermal interface materials.

The electronic device may be fabricated by a method comprising contacting the TIM described above with a first surface of the first electronic component and heating the TIM to a temperature above the melting point of the thermally conductive metal. The method may optionally further comprise contacting the TIM with a second surface of a second electronic component before heating. The thermally conductive metal, a), may be selected to have a melting point above the normal operating temperature of the electronic device and below the fabrication temperature of the device, thereby rendering the TIM a solid when the electronic device operates. Without wishing to be bound by theory, it is thought that this method of fabrication provides the benefits of forming bonds between the TIM and the electronic component without having the TIM flow out of the interface during normal operation. To facilitate this bond formation, a fluxing agent may optionally be employed when contacting the surfaces of the electronic components and heating. Optionally the surfaces of the electronic components may be metalized, e.g., coated with Au, to further improve adhesion. When the device operates, heat is dissipated from the first electronic component to the second electronic component.

Alternatively, a TIM in the electronic device described above may have a laminate structure. This TIM may comprise: a composite comprising a first thermally conductive metal having a first melting point, and particles in the first thermally conductive metal; and further comprising a layer of a second thermally conductive metal having a second melting point on a surface of the composite; where the first melting point is greater than the second melting point. Alternatively, the TIM may comprise the composite described above fabricated into a film having first and second opposing surfaces, where the first opposing surface has a layer of a second thermally conductive metal having a second melting point thereon, and the second opposing surface has a layer of a third thermally conductive metal having a third melting point thereon.

Figure 2:
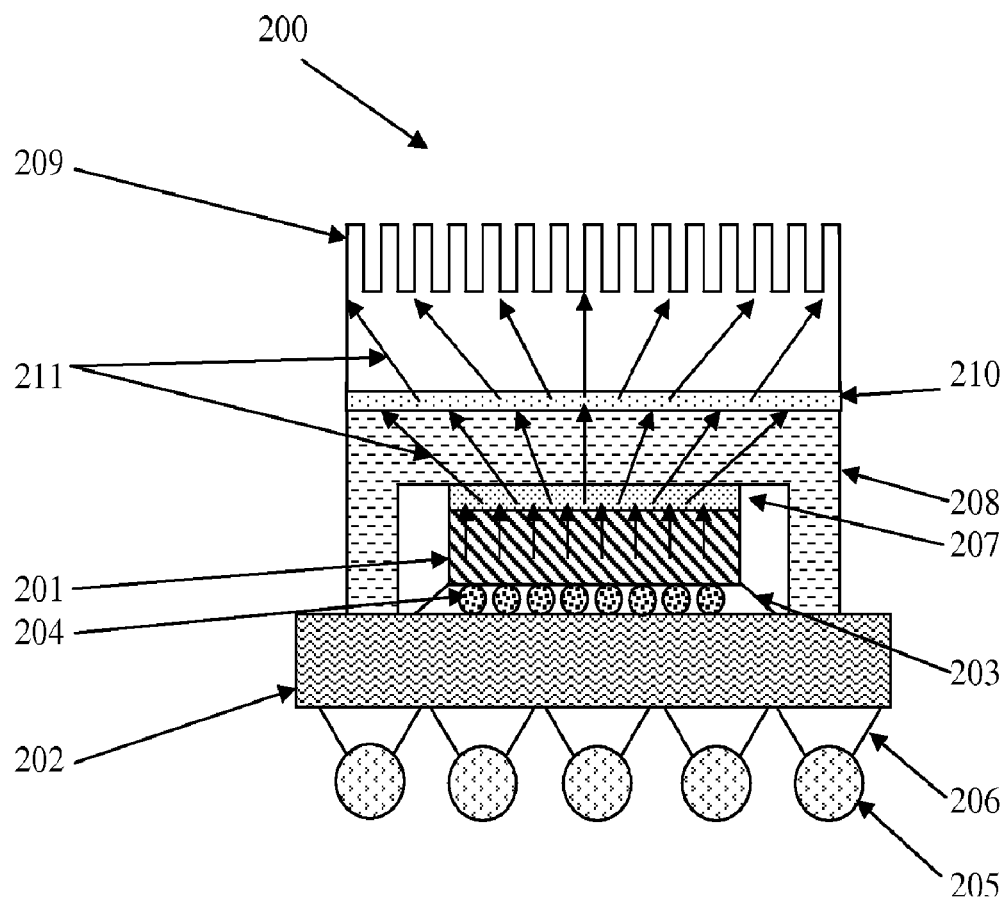
FIG. 2 is a cross section of an electronic device.

FIG. 2 shows a cross section of an exemplary electronic device 200. The device 200 comprises an electronic component (shown as an IC chip) 201 mounted to a substrate 202 through a die attach adhesive 203 containing spacers 204. The substrate 202 has solder balls 205 attached thereto through pads 206. A first thermal interface material (TIM1) 207 is interposed between the IC chip 201 and a metal cover 208. The metal cover 208 acts as a heat spreader. A second thermal interface material (TIM2) 210 is interposed between the metal cover 208 and a heat sink 209. Heat moves along a thermal path represented by arrows 211 when the device operates.

EXAMPLES

These examples are included to illustrate the invention to one of ordinary skill in the art and should not be interpreted as limiting the scope of the invention set forth in the claims. Those of skill in the art should, in light of the present disclosure, appreciate that many changes can be made in the specific embodiments which are disclosed and still obtain a like or similar result without departing from the spirit and scope of the invention set forth in the claims.

Reference Example 1

Preparation of Silicone Particles

The silicone particles used in example 12 were prepared by weighing 50 g of a methylhydrogen/dimethyl polysiloxane fluid having a kinematic viscosity of 107 centistokes, an approximate degree of polymerization of 100 and a hydrogen content of 0.083% was into a 100 g max cup. This was followed by weighing 1.87 g of hexadiene and two drops corresponding to approximately of 0.2 g of a soluble Pt catalyst consisting of Pt divinyltetramethyldisiloxane complex in a vinyl functional siloxane (the catalyst composition containing 0.5% elemental Pt) into the cup. The mixture was spun for 10 seconds in a SpeedMixer® DAC-150. 1.3 g of lauryl alcohol (20) ethoxylate 72% in water (Brij® 35L) was added followed by 8.0 g of DI water (initial water). The cup was spun at maximum speed in the DAC-150 SpeedMixer® for 20 seconds. The contents of the cup were inspected and the mixture was observed to have inverted into an oil/water (o/w) emulsion.

The cup was spun for an additional 20 seconds at maximum speed, after which 10 g of dilution water was added. The cup was spun for 15 seconds at approximately ½ of maximum speed. This was followed by adding an additional 15 g of dilution water and 15 seconds spinning at ½ of maximum speed. A final addition of water was made such that the total amount of dilution water that had been added was 35 g. The cup was placed into a 50° C. oven for 2 hours. The cup was cooled and particle size of the resulting silicone rubber dispersion was determined using a Malvern Mastersizer® S. The particles were harvested by filtration using a Buchner funnel equipped with standard laboratory filter paper. The resulting filter cake, which consisted of silicone rubber particles, was washed with an additional 100 mL of DI water during filtration. The filter cake was removed from the Buchner filter and placed into a glass baking dish and allowed to air dry overnight (~20 hours) at ambient laboratory conditions followed by an additional 2 hours in a 50° C. oven for 2 hours. Using a piece of paper, the dried particles were transferred to a glass jar for storage. Particle size results from the light scattering instrument was as follows: Dv50=15 micrometers; Dv90=25 micrometers.

Reference Example 2

Preparation of Silicone Rubber Particles

The particles used in example 11 were prepared by the following method. A dispersion of spherical silicone rubber particles was prepared according to the method of reference example 1. Instead of filtering, the dispersion was poured into a glass baking dish and allowed to evaporate at ambient laboratory conditions overnight (22 hours). The resulting mass was broken up with a spatula and an inverted small wide mouth glass jar equipped with a screw cap. The silicone particles were dried further in a 50° C. oven for 2 hours. The silicone particles were transferred into a glass jar for storage. These particles consisted of silicone rubber particles containing surfactant (Brij® 35L).

Reference Example 3

Preparation of Ag Treated Particles

The silicone particles used in example 2 were prepared by the following method. 50 g of a methylhydrogen/dimethyl polysiloxane fluid having a kinematic viscosity of 135 centistokes, an approximate degree of polymerization of 120 and a hydrogen content of 0.114% was weighed into a 100 g max cup. This was followed by 1.87 g of hexadiene and two drops corresponding to approximately of 0.2 g of a soluble Pt catalyst consisting mainly of Pt divinyltetramethyldisiloxane complex in a vinyl siloxane (0.5% elemental Pt in catalyst composition). The mixture was spun for 10 seconds in a SpeedMixer® DAC-150. 0.82 g of secondary alkyl sulfonate surfactant 60% in water (Hostapur® SAS 60) was added followed by 6.0 g of DI water (initial water). The cup was spun at maximum speed in the DAC-150 SpeedMixer® for 20 seconds. The contents of the cup were inspected and the mixture was observed to have inverted into an o/w emulsion.

The cup was spun for an additional 20 seconds at maximum speed after which 10 g of dilution water was added. The cup was spun for 15 seconds at approximately ½ of maximum speed. This was followed by adding an additional 15 g of dilution water and 15 seconds spinning at ½ of maximum speed. A final addition of water was made such that the total amount of dilution water that had been added was 35 g. The contents of the cup were transferred to a 250 mL jar and the capped jar was placed into a 50° C. oven for 2 hours. The jar was cooled to room temperature and particle size of the resulting silicone rubber dispersion was determined using a Malvern Mastersizer® S. 10 g of a 3% by weight aqueous solution of $AgNO_3$ was added to the emulsion contained in the jar and it was shaken by hand for several minutes. The jar was allowed to remain undisturbed for approximately 24 hours at ambient laboratory temperature.

The color of the emulsion changed from milky white to a very dark black-brown. The treated silicone elastomer particles were harvested by filtration using a vacuum filter flask and a Buchner funned equipped with ordinary laboratory filter paper. The filter cake was washed with DI water and allowed to dry at ambient temperature for 48 hours. The dried product was broken up by lightly crushing the agglomerates with an inverted two ounce wide mouth jar. The color of the particles was light brown. The presence of Ag was confirmed by X-ray fluorescence and found to be 0.1% by weight. The mean particle size as determined by light scattering of the aqueous emulsion prior to drying was 30 micrometers.

Example 1

Silicone Rubber Particles

Silicone particles were prepared by aqueous emulsion polymerization from poly(vinylsiloxane) and poly(hydrosiloxane) in the presence of platinum as catalyst. The average particle diameter was 50 micrometers (D90 diameter was 85 micrometers). An amount of 26.5 vol % of these silicone particles, was mixed with $In_{51}Bi_{32.5}Sn_{16.5}$ (melt point 60° C.). The mixture was heated to 70° C. and vigorously stirred for 5 minutes. After cooling to room temperature, the obtained mixture was compressed into thin film at 60° C. The film was cut into small size pieces for thermal conductive measurement, which was carried out by a guarded hot plate method according to ASTM D5470 Standard Test Method for Thermal Transmission Properties of Thermally Conductive Electrically Insulating Materials. A film with a thickness of 0.185 mm had thermal resistance of 0.252° $C.\cdot cm^2/W$ and an apparent thermal conductivity of 7.373 W/mK under a loading pressure of 36.2 psi. Apparent thermal conductivity means thickness divided by thermal resistance, correcting for differences in units.

Example 2

Silver Coated Silicone Rubber Particles

Silicone particles were prepared by aqueous emulsion polymerization from poly(vinylsiloxane) and poly(hydrosiloxane) in the presence of platinum as catalyst, and then coated silver by in situ wet metallization. The average particle diameter was 25 micrometers (D90 diameter was 45 micrometers) and silver was present in an amount of 0.18% based on the weight of the particles. An amount of 20.6 vol % these silicone particles together with 7.4 vol % of (epoxypropoxypropyl)methylsiloxane/dimethylsiloxane copolymer (which is commercially available as EMS-622 available from Gelest, Inc., of Morristown, Pa., USA) as surface treating agent were mixed with $In_{51}Bi_{32.5}Sn_{16.5}$. The mixture was heated to 70° C. and vigorously stirred for 2 minutes. After cooling to room temperature, the obtained mixture was compressed into a film at 60° C. The film was cut into small size pieces for thermal conductive measurement. One film with a thickness of 0.087 mm had thermal resistance of 0.188° $C.\cdot cm^2/W$ and apparent thermal conductivity of 4.413 W/mK under a loading pressure of 36.2 psi.

Comparative Example 3

No Particles $In_{51}Bi_{32.5}Sn_{16.5}$ was compressed into a film at 60° C. The film was cut into small size pieces for thermal conductive measurement. The film had thermal resistance of 1.932° $C.\cdot cm^2/W$ with a film thickness of 0.185 mm, and 0.499° $C.\cdot cm^2/W$ with a film thickness of 0.087 mm under a loading pressure of 36.2 psi. The apparent thermal conductivity of the film with thickness 0.185 mm was 0.958. W/mK, and the film with thickness of 0.087 mm had thermal conductivity of 1.743 W/mK.

Example 4

Alumina Particles

Alumina powder in a volume fraction of 22.8% was mixed with $In_{51}Bi_{32.5}Sn_{16.5}$. The mixture was heated to 70° C. and vigorously stirred for 2 minutes. After cooling to room temperature, the obtained mixture was compressed into a film at 60° C. The film was cut into small size pieces for thermal conductive measurement. The film with a thickness of 0.182 mm had thermal resistance of 0.951° $C.\cdot cm^2/W$ and apparent thermal conductivity of 1.892 W/mK under a loading pressure of 36.2 psi. The inventors surprisingly found that using uncoated silicone rubber particles in example 1 produced a TIM with lower thermal resistance and higher thermal conductivity than this TIM containing alumina particles.

Example 5

Fine Silicone Rubber Particles having an Average Diameter of 5 Micrometers

An amount of 27.7 vol % silicone rubber particles, DOW CORNING® 9506 with an average particle diameter of 5.15 micrometers and polydisperse index (PDI) of 1.40, was mixed with $In_{51}Bi_{32.5}Sn_{16.5}$. The mixture was heated to 70° C. and vigorously stirred for 2 minutes. After cooling to room temperature, the obtained mixture was compressed into a film at 60° C. The film was cut into small size pieces for thermal conductivity measurement. One film with a thickness of 0.185 mm had thermal resistance of 0.454° $C.\cdot cm^2/W$ and apparent thermal conductivity of 4.065 W/mK under a loading pressure of 36.2 psi.

Example 6

Fine Silicone Rubber Particles having an Average Diameter of 2 Micrometers

An amount of 23.4 vol % silicone rubber particles, DOW CORNING® EP-2100 with an average particle diameter of 1.39 micrometers and polydisperse index (PDI) of 1.14, was mixed with $In_{51}Bi_{32.5}Sn_{16.5}$. The mixture was heated to 70° C. and vigorously stirred for 2 minutes. After cooling to room temperature, the obtained mixture was compressed into a film at 60° C. The film was cut into small size pieces for thermal conductivity measurement. One film with a thickness of 0.184 mm had thermal resistance of 1.095° $C.\cdot cm^2/W$ and apparent thermal conductivity of 1.677 W/mK under a loading pressure of 36.2 psi.

Example 7

Silicone Rubber Particles having an Average Diameter of 16 Micrometers

Silicone particles were prepared by aqueous emulsion polymerization from poly(vinylsiloxane) and poly(hydrosiloxane) in the presence of platinum as catalyst and surfactant. The average particle diameter and PDI were 16.7 micrometers and 1.28, respectively. An amount of 28.7 vol % of these silicone particles was mixed with $In_{51}Bi_{32.5}Sn_{16.5}$ (melt point 60° C.). The mixture was heated to 70° C. and vigorously stirred for 5 minutes. After cooling to room temperature, the obtained mixture was compressed into a film at 60° C. The film with a thickness of 0.145 mm had thermal resistance of 0.471° C.·cm²/W and an apparent thermal conductivity of 3.081 W/mK under a loading pressure of 36.2 psi.

Example 8

Silicone Rubber Particles without surfactant having an Average Diameter of 15 Micrometers Silicone particles were prepared by aqueous emulsion polymerization from poly(vinylsiloxane) and poly(hydrosiloxane) in the presence of platinum as catalyst. The average particle diameter was 15 micrometers. An amount of 28.7 vol % of these silicone particles was mixed with $In_{51}Bi_{32.5}Sn_{16.5}$ (melt point 60° C.). The mixture was heated to 70° C. and vigorously stirred for 5 minutes. After cooling to room temperature, the obtained mixture was compressed into a film at 60° C. The film with a thickness of 0.143 mm had thermal resistance of 0.559° C.·cm²/W and an apparent thermal conductivity of 2.556 W/mK under a loading pressure of 36.2 psi.

Example 9

Impact of Silicone Rubber Particle Volume on Thermal Conductivity of the Composites of Alloy with a Low Melting Point Various amount of silicone rubber particles, Dow Corning Trefill E-601 with an average particle diameter of 0.77 micrometer and polydisperse index (PDI) of 1.26, was mixed with $In_{51}Bi_{32.5}Sn_{16.5}$. The mixture was heated to 70° C. and vigorously stirred for 2 minutes. After cooling to room temperature, the obtained mixture was compressed into a film at 60° C. The film was cut into small size pieces for thermal conductive measurement. Under a loading pressure of 36.2 psi, the apparent thermal conductivities for the composite films were 3.307 W/mK for the sample with 24.2 vol % of these silicone particles, and 1.865 W/mK for the sample with 32.3 vol % of these silicone particles.

Example 10

Silicone Rubber Particles with Surfactant in Soft Metal with a Low Melting Point Silicone particles were prepared by aqueous emulsion polymerization from poly(vinylsiloxane) and poly(hydrosiloxane) in the presence of platinum as catalyst. The average particle diameter was 25 micrometers as shown in reference example 1, above. An amount of 28.1 vol % of these silicone particles was mixed with soft indium (melt point 156.6° C.). The mixture was heated to 160° C. and ultrasonically mixed with indium for 5 minutes. After cooling to room temperature, the obtained mixture was compressed into a film at 120° C. The film with a thickness of 0.225 mm had thermal resistance of 0.309° C.·cm²/W and an apparent thermal conductivity of 7.282 W/mK under a loading pressure of 40 psi.

Example 11

Effect of Silicone Rubber Particle Size on Thermal Conductivity of the Composites of Metal with a Low Melting Point Silicone rubber particles with various average particle diameters were prepared by aqueous emulsion polymerization from poly(vinylsiloxane) and poly(hydrosiloxane) in the presence of platinum as catalyst, as shown in reference example 1, above. The mixture containing 28.8 vol % of silicone rubber particles was heated to 160° C. and ultrasonically mixed with indium for 5 minutes. After cooling to room temperature, the obtained mixture was compressed into a film at 120° C. The film was cut into small size pieces for thermal conductive measurement. The thermal resistance under a loading pressure of 40 psi for the composite films with a thickness of 0.397-0.425 mm are shown in FIG. 4.

Example 12

Silicone Rubber Particles in Indium Film Coated with Thermal Conductive Silicone Grease The silicone rubber particles with a 28.8 vol % content in indium film with a thickness of 0.190 mm was prepared by following the method shown in the above example 10, and a thermally conductive grease, DOW CORNING® SC 102, which is commercially available from Dow Corning Corporation of Midland, Mich., U.S.A. was coated on both the top and bottom sides of the indium composite film. The film had thermal resistance of 0.181° C.·cm²/W and an apparent thermal conductivity of 10.755 W/mK under a loading pressure of 40 psi. This film may be useful in test vehicles.

Example 13

Silicone Rubber Particles in Indium Film laminated with Metal Alloy with a Low Melting Point An indium composite film with a thickness of 0.263 mm was prepared by the same method as shown in the above example 10. Two films of $Sn_{42}Bi_{58}$ metal alloy (melt point 138.5° C.) prepared by pressing at 100° C. were stacked on both sides of the indium composite film, and formed into laminate film by pressing at 50° C. The laminate film with a total thickness of 0.313 mm had thermal resistance of 3.558° C.·cm²/W and an apparent thermal conductivity of 0.880 W/mK under a loading pressure of 40 psi. Without wishing to be bound by theory, it is thought that the rigidity of the $Sn_{42}Bi_{58}$ detrimentally affected conductivity and resistivity in this test method.

Comparative Example 14

No Particles

A metal alloy, $Sn_{42}Bi_{58}$, was compressed into a film at 132° C. The film was cut into small size pieces for thermal conductive measurement. The film had thermal resistance of 4.671° C.·cm²/W with a film thickness of 0.310 mm under a loading pressure of 40 psi, and the apparent thermal conductivity of the metal film was 0.664 W/mK. This comparative example, example 13, and example 10 show that both apparent thermal conductivity and thermal resistivity are detrimentally affected when no particles and a more rigid alloy are used.

Example 15

Silicone Rubber Particles in Indium Film laminated with Metal Alloy with a Low Melting Point-2

An indium composite film with a thickness of 0.263 mm was prepared by the same method as shown in the above example 10. Two films of $Bi_{50}Pb_{27}Sn_{10}Cd_{13}$ metal alloy (having melt point of 70° C.) prepared by pressing at 50° C. were stacked on both sides of the indium composite film, and formed into laminate film by pressing at 50° C. The laminate film with a total thickness of 0.378 mm had thermal resistance of 0.694° $C.\cdot cm^2/W$ and an apparent thermal conductivity of 5.454 W/mK under a loading pressure of 40 psi.

Example 16

Silicone Rubber Particles in Indium Film laminated with Metal with a Low Melting Point An indium composite film with a thickness of 0.185 mm was prepared by the same method as shown in the above example 10. Two indium films prepared by pressing at 100° C. were stacked on the both sides of the indium composite film, and formed into laminate film by pressing at 50° C. The laminate film with a total thickness of 0.235 mm had thermal resistance of 0.322° $C.\cdot cm^2/W$ and an apparent thermal conductivity of 7.271 W/mK under a loading pressure of 40 psi.

Example 17

Graphite Particles in Indium Composite Film

Expanded graphite from Graphite 3626 (Anthracite Industries, PA) particles in a volume fraction of 19.3% was mixed with indium. The mixture was heated to 170° C. and ultrasonically mixed with indium for 3 minutes. After cooling to room temperature, the obtained mixture was compressed into a film at 100° C. The film was cut into small size pieces for thermal conductive measurement. The film with a thickness of 0.330 mm had thermal resistance of 1.405° $C.\cdot cm^2/W$ and apparent thermal conductivity of 2.335 W/mK under a loading pressure of 40 psi. The silicone rubber particles in example 10 were used for producing a TIM with lower thermal resistance and higher thermal conductivity than this TIM containing graphite particles. It was surprisingly found that a composite containing conductive (e.g., graphite) particles had higher thermal resistance and lower thermal conductivity than the composite containing silicone particles in example 10.

Example 18

Silicone Rubber Particles Modified with Aluminum Oxide in Indium Film

The silicone rubber particles prepared by the same method as shown in example 1 were modified with 0.8 wt % aluminum oxide prepared by sol-gel chemistry using aluminum isopropoxide as the reaction precursor. The mixture of the modified silicone particles with indium was heated to 170° C. and ultrasonically mixed for 3 minutes. After cooling to room temperature, the obtained mixture was compressed into a film at 100° C. The film was cut into small size pieces for thermal conductive measurement. The film with a thickness of 0.130 mm had thermal resistance of 0.410° $C.\cdot cm^2/W$ and apparent thermal conductivity of 3.248 W/mK under a loading pressure of 40 psi.

Example 19

Silicone Rubber Particles Modified with Polymer in Indium Film

The silicone rubber particles prepared by the same method as shown in example 1 were modified with 16.2 wt % of poly(dimethylsiloxane)etherimide by solution blending. A mixture of the modified silicone particles with indium was heated to 170° C. and ultrasonically mixed for 3 minutes. After cooling to room temperature, the obtained mixture was compressed into a film at 100° C. The film was cut into small size pieces for thermal conductive measurement. The film with a thickness of 0.440 mm had thermal resistance of 1.023° $C.\cdot cm^2/W$ and apparent thermal conductivity of 4.300 W/mK under a loading pressure of 40 psi.

Example 20

Silicone Rubber Particles Modified with Polymer in Indium Film-2

The silicone rubber particles prepared by the same method as shown in example 1 were modified with 9.3 wt % of poly(Bisphenol A carbonate) by solution blending. A mixture of the modified silicone particles with indium was heated to 170° C. and ultrasonically mixed for 3 minutes. After cooling to room temperature, the obtained mixture was compressed into a film at 100° C. The film was cut into small size pieces for thermal conductive measurement. The film with a thickness of 0.420 mm had thermal resistance of 0.576° $C.\cdot cm^2/W$ and apparent thermal conductivity of 7.296 W/mK under a loading pressure of 40 psi.

Example 21

Silicone Rubber Particles Modified with Polymer in Indium Film-3

The silicone rubber particles prepared by the same method as shown in the above example 1 were modified with 9.2 wt % of thermoplastic polyurethane (Estane 58238, polyester polyurethane-75A, Neveon Inc, OH) by solution blending. A mixture of the modified silicone particles with indium was heated to 170° C. and ultrasonically mixed for 3 minutes. After cooling to room temperature, the obtained mixture was compressed into a film at 100° C. The film was cut into small size pieces for thermal conductive measurement. The film with a thickness of 0.323 mm had thermal resistance of 0.622° $C.\cdot cm^2/W$ and apparent thermal conductivity of 5.224 W/mK under a loading pressure of 40 psi.

Example 22

Silicone Rubber Particles Modified with Polymer in Indium Film-4

The silicone rubber particles prepared by the same method as shown in example 1 were modified with 9.4 wt % of poly[di(ethylene glycol)/cyclohexanedimethanol-alt-isophthaluc acid, sulfonated] with Tg 52° C. (458716, Aldrich) by solution blending. The mixture of the modified silicone particles with indium was heated to 170° C. and ultrasonically mixed for 3 minutes. After cooling to room temperature, the obtained mixture was compressed into a film at 100° C. The film was cut into small size pieces for thermal conductive measurement. The film with a thickness of 0.443 mm had thermal resistance of 0.717° $C.\cdot cm^2/W$ and apparent thermal conductivity of 6.181 W/mK under a loading pressure of 40 psi.

Comparative Example 23

Silica Gel Particles in Indium Composite Film

Silica gel particles with 230-400 mesh in particle diameter of 40-63 microns from Merck Grade 9385 in a volume fraction of 19.3% were mixed with indium. The mixture was heated to 170° C. and ultrasonically mixed for 3 minutes. After cooling to room temperature, the obtained mixture was compressed into a film at 100° C. The film was cut into small size pieces for thermal conductive measurement. The film with a thickness of 0.553 mm had thermal resistance of 1.763° C.·cm$^2$/W and apparent thermal conductivity of 3.136 W/mK under a loading pressure of 40 psi. The silicone rubber particles in example 10 were used for producing a TIM with lower thermal resistance and higher thermal conductivity than this TIM containing silica gel particles.

Example 24

Silicone Rubber Particle modified by Plasma in the Composites of Alloy with a Low Melting Point Silicone rubber particles, Dow Corning DY33-719 with particle diameter D(v, 0.5) of 6.23 micrometer were modified with $CO_2$ plasma on surface, and mixed with $In_{51}Bi_{32.5}Sn_{16.5}$. The mixture was heated to 70° C. and vigorously stirred for 2 minutes. After cooling to room temperature, the obtained mixture was compressed into a film at 60° C. The film was cut into small size pieces for thermal conductive measurement. The data of apparent thermal conductivity under a loading pressure of 36.2 psi for the composite films are 2.173 W/mK for the sample with a thickness of 0.200 mm and 29.7 vol % of these silicone particles. The composite film with silicone particles without any surface modification had 1.158 W/mK for the sample with a thickness of 0.172 mm with 29.7 vol % of these silicone particles.

Example 25

Silicone Rubber Particle modified by Plasma in the Composites of Alloy with a Low Melting Point-2

Silicone rubber particles, Dow Corning DY33-719 with particle diameter D(v, 0.5) of 6.23 micrometer were modified with tetraethyl orthosilicate (TEOS) plasma on surface, and mixed with $In_{51}Bi_{32.5}Sn_{16.5}$. The mixture was heated to 70° C. and vigorously stirred for 2 minutes. After cooling to room temperature, the obtained mixture was compressed into a film at 60° C. The film was cut into small size pieces for thermal conductive measurement. The data of apparent thermal conductivity under a loading pressure of 36.2 psi for the composite films are 1.724 W/mK for the sample with a thickness of 0.168 mm and 28.7 vol % of these silicone particles.

Industrial Applicability

The TIM described herein is useful in both TIM1 and TIM2 applications. The TIM described herein may provide the benefit of reduced cost as compared to conventional TIMs. Alloys useful as the thermally conductive metal in the TIM can be expensive, particularly those containing Indium. Without wishing to be bound by theory, it is thought that the coarse polymeric particles also may improve compliancy and ductility as compared to a thermally conductive metal that does not contain coarse polymeric particles or that contains particles of a less compliant material, such as alumina particles. Improving compliancy and ductility may reduce or eliminate the need for Indium in the thermally conductive metal in the TIM and may allow for reduction of bondline thickness. Furthermore, increased compliancy and ductility may reduce the need for flux, or solder reflow, or both. Therefore, cost reduction may be achieved in several ways; i.e., by reducing the amount of alloy needed in the first place by reducing bondline thickness and replacing some of the alloy with particles, by changing the composition of the alloy to include less expensive elements, and also by reducing the need for flux and/or solder reflow steps during processing. Furthermore, increased compliancy and ductility may also improve thermal conductivity of the TIM.

Without wishing to be bound by theory, it is also thought that the TIM of this invention may have improved mechanical durability. Without wishing to be bound by theory, it is thought that increasing apparent thermal conductivity means that compliancy of the TIM also increases. Without wishing to be bound by theory, the coarse particles may improve compliancy of the TIM and thereby improve interface contact as compared to TIMs containing fine particles.

Without wishing to be bound by theory, it is thought that the TIM shown in FIG. 3 may offer the added benefit of improved gap filling on a substrate the TIM contacts, as compared to a TIM with a higher melting point thermally conductive metal contacting the substrate.

The invention claimed is:
1. A thermal interface material comprising:
   a) a continuous phase of a thermally conductive metal in the thermal interface material,
   b) a discontinuous phase of coarse polymeric particles in the thermal interface material dispersed in the thermally conductive metal;
   where the thermally conductive metal has a melting point above a normal operating temperature of an electronic device and below a fabrication temperature of the electronic device and the coarse polymeric particles have an average particle size of at least 15 micrometers.
2. The thermal interface material of claim 1, where the thermally conductive metal is Indium-free.
3. The thermal interface material of claim 1, where the thermally conductive metal is selected from the group consisting of Silver, Bismuth, Gallium, Indium, Tin, Lead, and alloys thereof.
4. The thermal interface material of claim 1, where the particles are present in an amount ranging from 1 to 50% by volume.
5. The thermal interface material of claim 1, where the particles have an average diameter ranging from 10% to 100% of the thickness of the thermal interface material.
6. The thermal interface material of claim 1, where the particles have a metal or a metal oxide provided on a surface of the particles.
7. The thermal interface material of claim 1, where the particles have SiH functionality.
8. The thermal interface material of claim 1, where the particles comprise an organic polymer selected from the group consisting of polycarbonate, polyester, polyether sulfone, polyether ether ketone, polyisobutylene, polyolefins, polyphenylsulfide, polystyrene, polyurethane, and their halogenated derivatives, and a combination thereof.
9. The thermal interface material of claim 1, where the particles have an elastic modulus that is lower than the elastic modulus of the thermally conductive metal.
10. The thermal interface material of claim 1, where the particles have a surface treatment.
11. An electronic device comprising
   i) a first electronic component,
   ii) a second electronic component, and
   iii) a thermal interface material interposed between the first electronic component and the second electronic component; where the thermal interface material comprises a) a continuous phase of a thermally conductive metal in the thermal interface material, and
b) a discontinuous phase of coarse polymeric particles in the thermal interface material dispersed in the thermally conductive metal, where the coarse polymeric particles have an average particle size of at least 15 micrometers.

12. The device of claim 11, where the first electronic component is a semiconductor chip and the second electronic component is a heat sink.

13. The device of claim 11, where the first electronic component is a semiconductor chip and the second electronic component is a heat spreader.

14. The device of claim 11, where the first electronic component is a heat spreader and the second electronic component is a heat sink.

15. A method of fabricating an electronic device comprising:
   i) contacting a thermal interface material with a first surface of a first electronic component, where the thermal interface material comprises
   a) a continuous phase of a thermally conductive metal in the thermal interface material, and
   b) a discontinuous phase of coarse polymeric particles in the thermal interface material dispersed in the thermally conductive metal, where the coarse polymeric particles have an average particle size of at least 15 micrometers; and
   ii) heating the thermal interface material to a temperature above the melting point of the thermally conductive metal.

16. The method of claim 15, wherein with a layer of fluxing agent is used between the thermal interface material, and the first and second electronic components.

17. The method of claim 15, further comprising contacting the thermal interface material with a second surface of a second electronic component before step ii).

18. A method comprising:
   i) interposing a thermal interface material along a thermal path in an electronic device comprising a first electronic component and a second electronic component, where the thermal interface material comprises
   a) a continuous phase of a thermally conductive metal in the thermal interface material, and
   b) a discontinuous phase of coarse polymeric particles in the thermal interface material dispersed in the thermally conductive metal, where the coarse polymeric particles have an average particle size of at least 15 micrometers; and
   ii) operating the electronic device, thereby dissipating heat from the first electronic component to the second electronic component.

19. A method for preparing a thermal interface material comprising:
   1) combining a continuous phase of a thermally conductive metal in the thermal interface material with a discontinuous phase of coarse polymeric particles having an average particle size of at least 15 micrometers, in the thermal interface material thereby forming a composite comprising the coarse polymeric particles dispersed in the thermally conductive metal, and
   optionally 2) fabricating the composite to a desired thickness, and
   optionally 3) forming the composite into a desired shape.

20. The method of claim 19, where step 1) is performed by a process comprising:
   i) mixing thermally conductive metal particles with the coarse polymeric particles, and
   thereafter ii) heating the thermally conductive metal particles above their melting point.

21. The method of claim 19, where step 1) is performed by a process comprising:
   i) heating the thermally conductive metal above its melting point, and
   ii) mixing the coarse polymeric particles with the product of step i).

22. The method of claim 19, where step 1) is performed by a process comprising:
   i) wrapping the coarse polymeric particles in a sheet or foil of the thermally conductive metal, and
   thereafter ii) reflowing the thermally conductive metal.

23. The method of claim 19, where step 1) is performed by a process comprising:
   i) applying the coarse polymeric particles and thermally conductive metal particles to a substrate, and
   thereafter ii) reflowing the thermally conductive metal.

24. The method of claim 19, where step 2) is present, and step 2) is performed by a process selected from:
   a) compressing, optionally with heating;
   b) extrusion pressing; or
   c) roll milling.

25. The method of claim 19, where step 3) is present, and step 3) is performed by a process selected from:
   a) cutting the product of step 1) or step 2) into the desired shape,
   b) molding the product of step 1) into the desired shape.

26. A thermal interface material comprising:
   I) a composite having a surface, where the composite comprises
      a) a continuous phase of a first thermally conductive metal having a first melting point in the thermal interface material, and
      b) a discontinuous phase of coarse polymeric particles in the thermal interface material in the first thermally conductive metal; and
   II) a second thermally conductive metal having a second melting point on the surface;
   where the first melting point is greater than the second melting point.

27. The thermal interface material of claim 26, where the coarse polymeric particles have an average diameter of at least 15 micrometers.

28. The thermal interface material of claim 26, where the second thermally conductive metal is selected such that the second melting point is at least 5° C. lower than the first melting point.

29. An electronic device comprising
   i) a first electronic component,
   ii) a second electronic component,
   iii) a thermal interface material interposed between the first electronic component and the second electronic component, where the thermal interface material comprises
      I) composite having a surface, where the composite comprises
         a) a continuous phase of a first thermally conductive metal having a first melting point in the thermal interface material, and
         b) a discontinuous phase of coarse polymeric particles in the thermal interface material in the first thermally conductive metal; and
      II) a second thermally conductive metal having a second melting point, where the second thermally conductive metal is on the surface of the composite; and
      where the first melting point is greater than the second melting point.

30. A method of fabricating an electronic device comprising:
  i) contacting a thermal interface material with a first surface of a first electronic component, where the thermal interface material comprises
    I) a composite having a surface, where the composite comprises
      a) a continuous phase of a first thermally conductive metal having a first melting point in the thermal interface material, and
      b) a discontinuous phase of coarse polymeric particles in the thermal interface material in the first thermally conductive metal; and
    II) a second thermally conductive metal having a second melting point where the second thermally conductive metal is on the surface of the composite;
    where the first melting point is greater than the second melting point; and
  ii) heating the thermal interface material to a temperature above the second melting point.

31. The method of claim 30, where the temperature in step ii) is below the first melting point.

32. A method comprising:
  i) interposing a thermal interface material along a thermal path in an electronic device comprising a first electronic component and a second electronic component, where the thermal interface material comprises
    I) a composite having a surface, where the composite comprises
      a) a continuous phase of a first thermally conductive metal having a first melting point in the thermal interface material, and
      b) a discontinuous phase of coarse polymeric particles in the thermal interface material in the first thermally conductive metal; and
    II) a second thermally conductive metal having a second melting point, where the second thermally conductive metal is on the surface of the composite; and
  ii) operating the electronic device, thereby dissipating heat from the first electronic component to the second electronic component.

33. A method for preparing a thermal interface material comprising:
  1) combining a continuous phase of a first thermally conductive metal in the thermal interface material with a discontinuous phase of coarse polymeric particles in the thermal interface material, thereby forming a composite comprising the coarse polymeric particles in the first thermally conductive metal, and
  optionally 2) fabricating the composite to a desired thickness, and
  optionally 3) forming the composite into a desired shape, and
  4) applying a second thermally conductive metal on a surface of the composite.

34. The method of claim 33, where step 4) is performed by a process comprising:
  i) pressing a second thermally conductive metal onto a surface of the composite; and
  optionally ii) heating.

35. The method of claim 33, further comprising: 5) applying a third thermally conductive metal onto a second surface of the composite.

36. A thermal interface material comprising:
  I) a composite having a surface, where the composite comprises
    a) a continuous phase of a thermally conductive metal in the thermal interface material, and
    b) a discontinuous phase of coarse polymeric particles in the thermal interface material in the thermally conductive metal; and
  II) a thermally conductive material on the surface of the composite.

37. The thermal interface material of claim 36, where the coarse polymeric particles have an average diameter of at least 15 micrometers.

38. The thermal interface material of claim 36, where the thermally conductive material is a thermally conductive compound.

39. An electronic device comprising
  i) a first electronic component,
  ii) a second electronic component,
  iii) a thermal interface material interposed between the first electronic component and the second electronic component, where the thermal interface material comprises
    I) a composite having a surface, where the composite comprises
      a) a continuous phase of a thermally conductive metal in the thermal interface material, and
      b) a discontinuous phase of coarse polymeric particles in the thermal interface material in the thermally conductive metal; and
    II) a thermally conductive material on the surface of the composite.

40. A method of fabricating an electronic device comprising:
  i) contacting a thermal interface material with a first surface of a first electronic component, where the thermal interface material comprises
    I) a composite having a surface, where the composite comprises
      a) a continuous phase of a thermally conductive metal in the thermal interface material, and
      b) a discontinuous phase of coarse polymeric particles in the thermal interface material in the thermally conductive metal; and
    II) a thermally conductive material on the surface of the composite; and
  ii) heating the thermal interface material.

41. A method comprising:
  i) interposing a thermal interface material along a thermal path in an electronic device comprising a first electronic component and a second electronic component, where the thermal interface material comprises
    I) a composite having a surface, where the composite comprises
      a) a continuous phase of a thermally conductive metal in the thermal interface material, and
      b) a discontinuous phase of coarse polymeric particles in the thermal interface material in the first thermally conductive metal; and
    II) a thermally conductive material on the surface of the composite; and
  ii) operating the electronic device, thereby dissipating heat from the first electronic component to the second electronic component.

42. A method for preparing a thermal interface material comprising:
  1) combining a continuous phase of a thermally conductive metal in the thermal interface material with a discontinuous phase of coarse polymeric particles in the thermal interface material, thereby forming a composite comprising the coarse polymeric particles in the thermally conductive metal, and optionally 2) fabricating the composite to a desired thickness, and optionally 3) forming the composite into a desired shape, and 4) applying a thermally conductive material on a surface of the composite.

43. The method of claim 42, further comprising: 5) applying a second thermally conductive material to another surface of the composite.

* * * * *